United States Patent [19]
Yamauchi et al.

[11] Patent Number: 5,401,993
[45] Date of Patent: Mar. 28, 1995

[54] NON-VOLATILE MEMORY

[75] Inventors: Yoshimitsu Yamauchi, Yamatokoriyama; Kenichi Tanaka, Nara; Keizo Sakiyama, Kashihara, all of Japan

[73] Assignee: Sharp Kabushiki Kaisha, Osaka, Japan

[21] Appl. No.: 83,873

[22] Filed: Jun. 30, 1993

Related U.S. Application Data

[63] Continuation of Ser. No. 747,971, Aug. 21, 1991, abandoned.

[30] Foreign Application Priority Data

Aug. 30, 1990 [JP] Japan ................. 2-231800

[51] Int. Cl.⁶ ............. H01L 27/02; H01L 29/68; H01L 29/78; H01L 29/92
[52] U.S. Cl. .............. 257/321; 257/322; 257/298
[58] Field of Search ........... 357/51, 23.6; 365/96, 365/103, 225.6; 257/321, 322, 298

[56] References Cited

U.S. PATENT DOCUMENTS

| 4,491,857 | 1/1985 | McElroy ............ 357/23 |
| 4,507,756 | 3/1985 | McElroy ............ 365/104 |
| 4,507,757 | 3/1985 | McElroy ............ 365/104 |
| 4,823,181 | 4/1989 | Moshen et al. ........ 357/51 |
| 4,878,100 | 10/1989 | McDavid ............ 357/23.3 |
| 4,906,587 | 3/1990 | Blake ............... 437/41 |
| 5,049,957 | 9/1991 | Inoue et al. .......... 357/23.6 |
| 5,060,034 | 10/1991 | Shimizu et al. ....... 357/23.5 |

FOREIGN PATENT DOCUMENTS

| 57-111855 | 7/1982 | Japan ............. 365/96 |
| 61-84868 | 4/1986 | Japan ............. 257/321 |
| 63-224355 | 9/1988 | Japan ............. 365/103 |

OTHER PUBLICATIONS

Mizutani et al., 'A New EPROM Cell with a Side-Wall Floating Gate . . .' IEDM, pp. 635-637, 1985.

Primary Examiner—Andrew J. James
Assistant Examiner—Stephen D. Meier

[57] ABSTRACT

A non-volatile memory includes a single transistor having a semiconductor substrate, source and drain diffusion layers formed on a surface of the semiconductor substrate, and a gate electrode provided on the semiconductor substrate with a gate insulating film interposed between them. The non-volatile memory further includes a programmable insulating film provided in self-alignment between the gate electrode and at least one of the source and drain diffusion layers and the programmable insulating film is broken down by a voltage applied to the gate electrode so as to execute programming.

8 Claims, 4 Drawing Sheets

NON-VOLATILE MEMORY

This application is a continuation of application Ser. No. 07/747,971, filed on Aug. 21, 1991, now abandoned.

BACKGROUND OF THE INVENTION

1. Field of the Invention

The present invention relates to an electrically reloadable non-volatile memory, and more specifically, it relates to an anti-fuse type OTP (One Time Programmable ROM) in which programming (writing) is executed by breaking down a programmable insulating film of a capacitor.

2. Description of the Related Art

Conventionally, this type of non-volatile memory cell is composed of a single transistor and a single contact-sized capacitor on a silicon substrate.

However, although the single contact-sized capacitor is formed on a drain diffusion layer of the transistor, an insulating film of the capacitor and the gate electrode are disposed on the silicon substrate at a considerable distance from each other. Therefore, it is difficult to reduce the size of the cell because misalignment must be avoided in fabricating the cell.

Accordingly, it is an object of the present invention to provide a non-volatile memory of which a cell having a single transistor can be reduced in size and can be adjustable for to mass storage.

SUMMARY OF THE INVENTION

The present invention provides a non-volatile memory which includes a single transistor, comprising a semiconductor substrate, source and drain diffusion layers formed on a surface of the semiconductor substrate, and a gate electrode provided on the semiconductor substrate with a gate insulating film interposed between the gate electrode and the semiconductor substrate; and further comprising an insulating film for programming provided between the gate electrode and at least one of the source and drain diffusion layers and the programmable insulating film is broken down by voltage applied to the gate electrode so as to execute programming.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
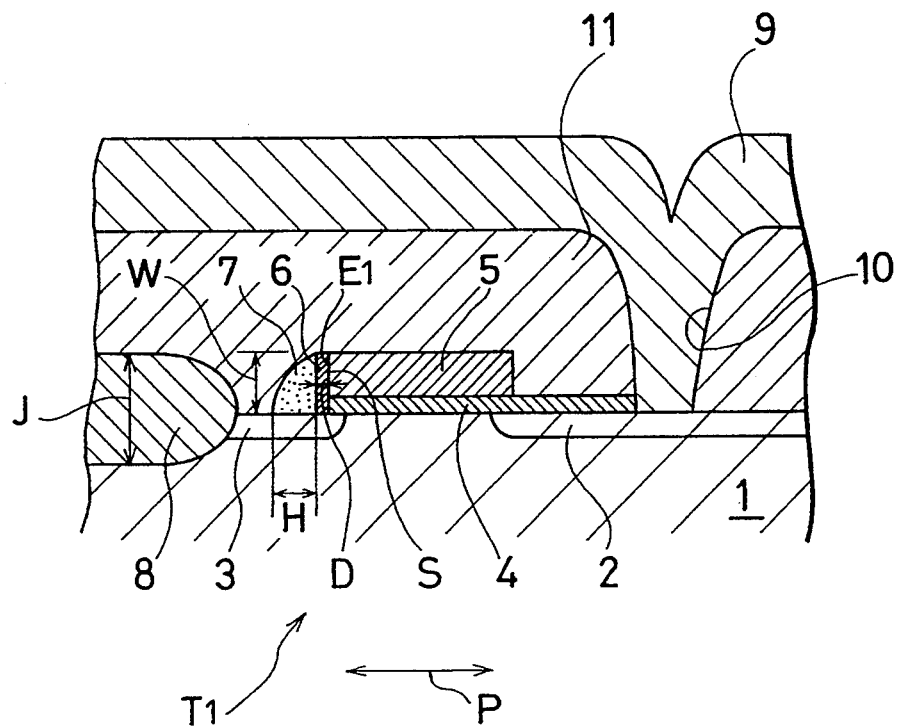
FIG. 1 is a diagram showing a major portion of a first embodiment according to the present invention.

The most significant characteristic of the present invention is that a memory is provided on a wall close to a gate electrode without interposing elements so that its cell can be reduced in size and the memory can be adjusted for mass storage. A programmable insulating film in this memory is formed in self-alignment.

Specifically, an embodiment of the present invention provides a non-volatile memory including a single transistor; for example, (i) it includes a programmable SiN insulating film 6, which is positioned between a gate electrode 5 and a polysilicon spacer 7 in ohmic-contact with a diffusion layer (drain) 3 while the programmable SiN insulating film 6 itself is in contact with the drain 3. The programmable SiN insulating film 6 is broken down so as to execute programming. Naturally, the polysilicon side wall 7 is formed on a step (side wall) $E_1$ of the gate electrode 5 close to the drain.

Figure 4:
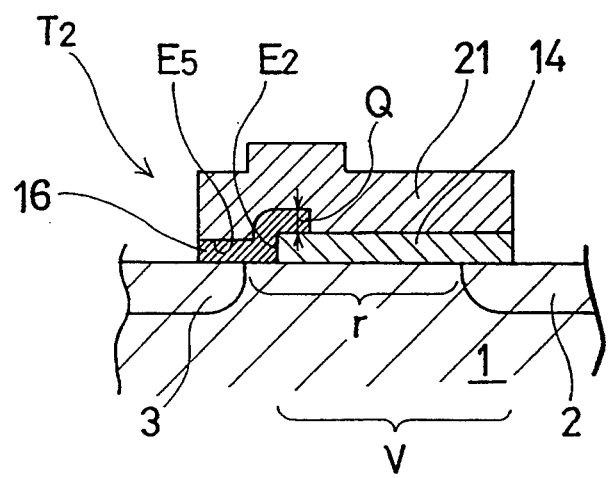
FIGS. 4, 5(a), 5(b) and 5(c) are diagrams showing a partial configuration of a second embodiment according to the present invention and a method of manufacturing this configuration.

Also, the present invention provides an OTP cell; as shown in FIG. 4, (ii) it includes a programmable $Si_xN_{1-x}$ ($0<X<1$) insulating film 16, which is positioned between a drain 3 of a single transistor and a lower face $E_5$ of a gate electrode 21 close to a drain so as to be in contact with the drain 3. The programmable $Si_xN_{1-x}$ film 16 is broken down by voltage applied to the gate electrode 21 so as to execute programming.

Figure 6:
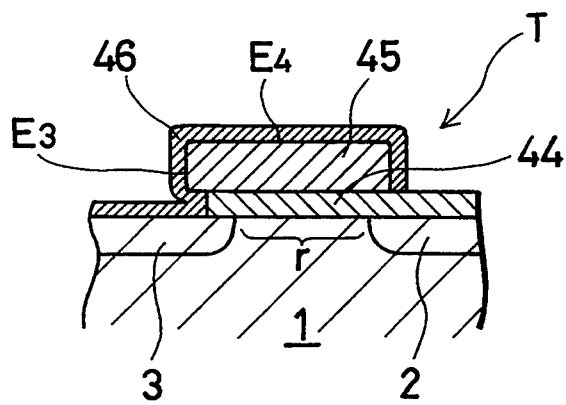
FIGS. 6, 7(a,) 7(b), 7(c) and 7(d) are diagrams corresponding to FIGS. 4 and 5(a)–5(c) showing a third embodiment according to the present invention.

Furthermore, the present invention provides an OTP cell; as shown in FIG. 6, (iii) the cell includes an $Si_xN_{1-x}$ ($0<X<1$) insulating film 46, which is provided between a drain 3 of a single transistor and a step (side wall) $E_3$ of a gate electrode 45 close to a drain and over an upper face $E_4$ of the gate electrode 45 so as to be in contact with the drain 3. The programmable $Si_xN_{1-x}$ insulating film 46 is broken down by voltage applied to the gate electrode 45 to execute programming.

Now, the present invention will be described in detail in conjunction with the preferred embodiments shown in the accompanying drawings. However, the present invention is not precisely limited to the following description.

FIG. 1 shows a first embodiment according to the present invention.

In FIG. 1, the non-volatile memory includes a single transistor $T_1$ having a Si substrate 1, source and drain diffusion layers 2 and 3 formed in a major surface of the substrate 1, and the gate electrode 5 as a select gate provided on the Si substrate 1 with the $SiO_2$ gate insulating film 4 interposed between them. The memory further includes the programmable SiN insulating film 6 which is provided between the gate electrode 5 and the drain diffusion layer 3, having a thickness W of about; 3000 Å and a lateral width D of 80 Å in $SiO_2$ film equivalent, or otherwise, the memory may include a composite programmable insulating film made of $SiO_2$-SiN film.

The programmable SiN insulating film 6 is provided between the step $E_1$ of the gate electrode 5 close to the drain 3 and the polysilicon spacer 7 in ohmic-contact with the drain 3.

The programmable SiN insulating film 6 and the spacer 7 formed on the step (side wall) $E_1$ of the gate electrode 5 can be disposed in self-alignment by well-known methods.

For example, after the gate electrode 5, the source 2 and the drain 3 are formed, a SiN film of 140 Å thickness is deposited on the Si substrate 1 including the gate electrode 5; thereafter, the resultant SiN film is etched back until the SiN film remains merely on the step (side wall) $E_1$ of the gate electrode 5 close to the drain. Additionally, a polysilicon film of 3000 Å thickness is formed over the entire surface of the Si substrate 1 including the SiN film, and then, the polysilicon film is etched back until the polysilicon film which has the maximum lateral width H of 3000 Å and serves as a side wall of the gate electrode 5 remains close to the drain 3 with the programmable SiN insulating film 6 interposed. The resultant polysilicon film is the spacer 7.

Reference numeral 8 denotes a SiO$_2$ locos film having a thickness J of 4000 Å, which serves as an element isolating film. On the Si substrate 1 including the gate electrode 5, a SiO$_2$ layer insulating film 11 is formed having a contact hole 10 for connecting the source diffusion layer 2 and a bit line 9.

As has been described, according to the present embodiment, the programmable SiN insulating film 6 is provided contiguous to the step E$_1$ of the gate electrode 5 close to the drain, the spacer 7 serving as the side wall of the gate electrode 5 is in ohmic-contact with the drain 3, and the programmable insulating film 6 is sandwiched between the spacer 7 and the gate electrode 5, so that the cell can be made of a small size.

Practically, the cell can, be reduced in the lateral width (in the direction of arrow symbolized by P in FIG. 1), as compared with a conventional cell where an insulating film and gate electrode in a capacitor are disposed at a considerable distance from each other on a silicon substrate.

Figure 2:
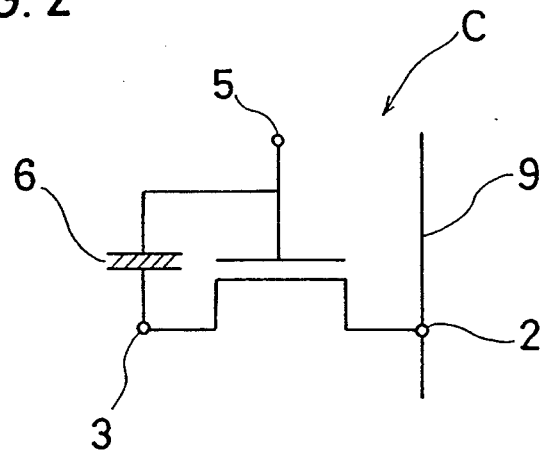
FIGS. 2 and 3 are circuit diagrams for explaining a programming method according to an embodiment of the present invention.

FIG. 2 is an equivalent circuit of a cell C in the above embodiment.

Figure 3:
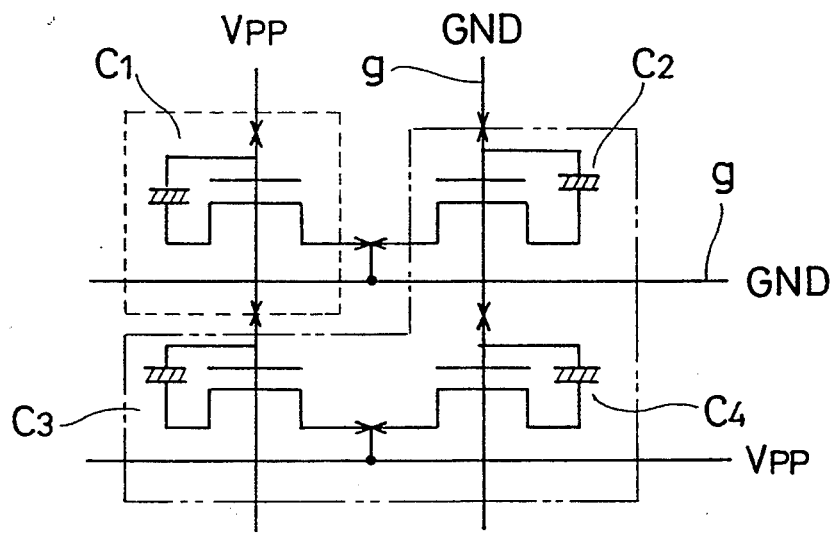

FIG. 3 shows the theory of the programming operation of the cell C in the above embodiment.

In FIG. 3, there are four cells C$_1$, C$_2$$_l$, C$_3$ and C$_4$, the cell C$_1$ is a programming cell while the remaining three cells C$_2$, C$_3$ and C$_4$ are non-programming cells. Reference character "g" designates a GND while "Vpp" designates supply voltage.

FIG. 4 shows a second embodiment according to the present invention.

In FIG. 4, similar to the cell in the first embodiment, a cell is composed of a single transistor T$_2$, where the programmable SiN insulating film 16 which is provided between the drain diffusion region 3 and the gate electrode 21 is broken down by a voltage applied to the gate electrode 21 so as to execute programming.

Just under the gate electrode 21 in a region V, which covers a channel region r and the source diffusion region 2 of the transistor T$_2$ on the silicon substrate 1, an SiO$_2$ gate insulating film 14 is provided. The cell has the programmable SiN insulating film 16 among a side wall E$_2$ of the gate insulating film 14, the drain diffusion region 3 and the lower face E$_5$ of the gate electrode 21.

The programmable insulating film 16 is formed of Si$_x$N$_{1-x}$ ($0<X<1$). Thus, a charge Q$_{BD}$ for breaking down the programmable Si$_x$N$_{1-x}$ insulating film 16 varies from one order to two orders from a charge for breaking down the SiO$_2$. For example, when the Si$_x$N$_{1-x}$ insulating film 16 and the SiO$_2$ film are set at the identical thickness 100 Å, the charge Q$_{BD}$ for breaking down the films are 1 coulomb and $10^{-2}$ coulomb, respectively.

Now, a method of fabricating the cell will be explained.

Figure 5A:
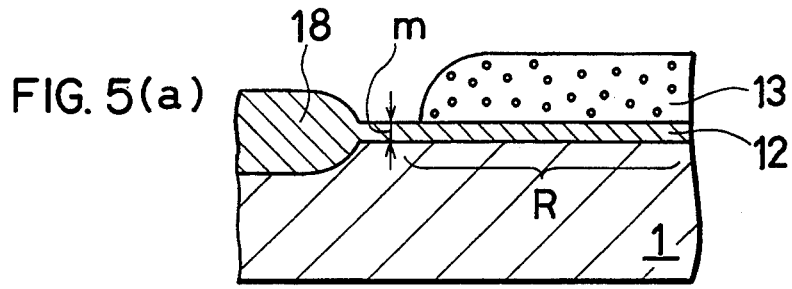

First, as shown in FIG. 5(a), on a p-type Si substrate which includes an SiO$_2$ element insulating region (LOCOS film) 18 and the SiO$_2$ gate insulating layer 12 having a thickness m of 140 Å, a resist pattern 13 is formed in a specified region R of the gate insulating layer 12 by patterning a resist layer for creating a gate insulating film.

Figure 5B:
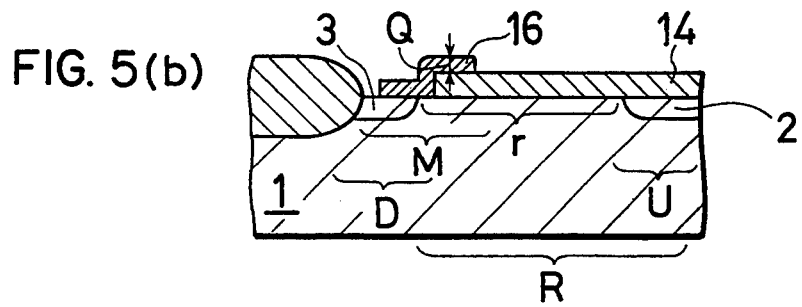

Then, using a mask of the resist pattern 13, the gate insulating layer 12 on an upper surface of the locos film 18 and in the region except for the specified region R is removed to form the gate insulating film 14. After that, impurities are introduced into a pre-drain region D and a pre-source region U on the Si substrate 1 by n-type ion implantation using a mask (not shown). Then, the wafer is heated to diffuse the impurities, so that the n-type drain 3 of high concentration and the n-type source 2 of high concentration are formed. After that, on the Si substrate 1, a Si$_3$N$_4$ film 16 having a thickness Q of 140 Å is formed in a region M extending from the drain region 3 to an upper face of one end of the gate insulating film 14, and Si$_3$N$_4$ film 16 serves as a programmable insulating film [see FIG. 5(b)]. The region r is a channel region.

Figure 5C:
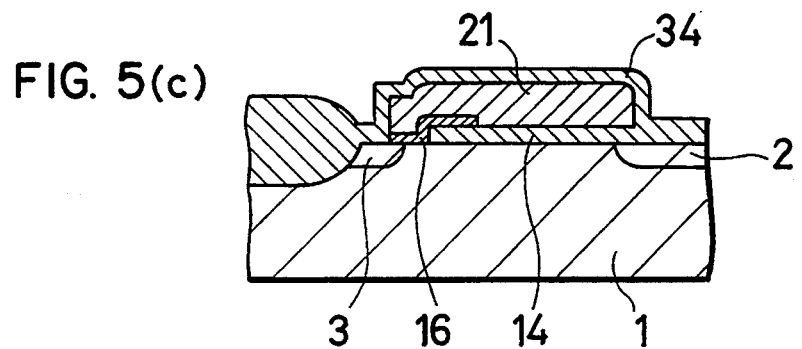

Then, after a polysilicon layer of 3000 Å thickness is deposited on the overall surface on the Si substrate including the programmable insulating film, the gate electrode 21 is formed to cover the overall Si$_3$N$_4$ film 16 by a well-known photolithography technique. Moreover, an SiO$_2$ layer 34 is deposited on the overall surface on the Si substrate 1 including the gate electrode 21 [see FIG. 5(c)]. Furthermore, after a layer insulating layer of SiO$_2$ or the like (not shown) is deposited on the overall surface, a contact hole connecting to the source 2 is formed. Then, after a metal layer of Al or the like is deposited on the overall surface, the resultant metal layer is patterned to form a bit line.

In this way, the intended memory is fabricated. Its equivalent circuit and programming method is identical with the above-mentioned first embodiment (see FIGS. 2 and 3).

FIG. 6 shows a third embodiment according to the present invention, in which an SiO$_2$ gate insulating film 44 is provided on source and drain diffusion layers 2 and 3 and a channel region r between the source and drain diffusion layers 2 and 3, and the programmable Si$_3$N$_4$ insulating film 46 is provided on the upper face E$_4$ of the gate electrode 45, oh the side wall E$_3$ of the gate electrode 45 and on the drain diffusion layer 3.

A method of fabricating the cell will now be described.

Figure 7A:
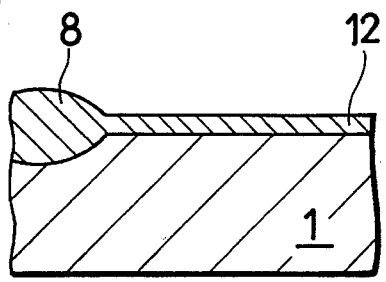

First, as shown in FIG. 7(a), a p-type Si substrate 1 having an SiO$_2$ locos film 8 and an SiO$_2$ insulating layer 12 of 140 Å thickness is formed.

Figure 7B:
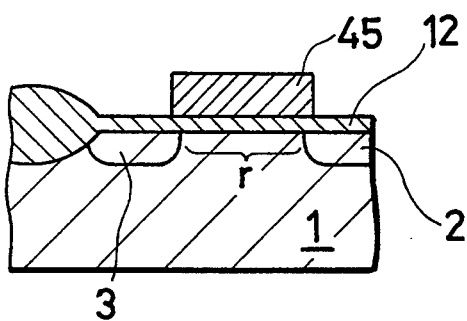

Then, a polysilicon layer of 3000 Å thickness is deposited on the overall surface on the Si substrate 1, and the polysilicon layer is patterned to form the gate electrode 45 on the gate insulating layer 12 [see FIG. 7(b)].

Figure 7C:
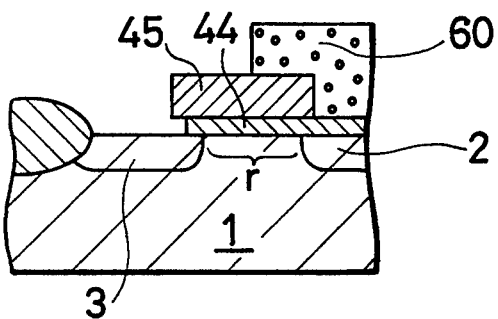

Next, using a mask of the gate electrode 45, impurities are introduced by well-known methods of ion implantation or the like to form the source 2 and the drain 3, while using a resist pattern 60, which covers the source 2 on one side of and under the gate electrode 45, the gate insulating layer 12 and the locos film 8 are etched to form the gate insulating film 44 extending on the channel region r and the source 2 [see FIG. 7(c)]. In this way, while the gate insulating layer on the drain 3 is removed, the gate insulating layer on the source region 2 remains.

Figure 7D:
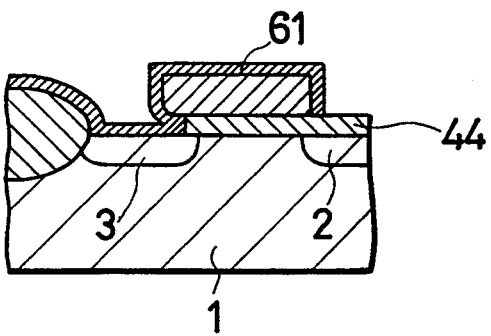

After the resist pattern 60 is removed, an Si$_3$N$_4$ layer 61 is deposited on the overall surface on the Si substrate 1 including the gate electrode 45 by well-known depositing method, such as LPCVD [see FIG. 7(d)].

The Si$_3$N$_4$ layer is left only in a region extending on the gate electrode 45 and on the drain 3, and the remaining layer serves as the programmable Si$_3$N$_4$ insulating film 46 [see FIG. 6]. The process of making a bit line on the surface after that is similar to that in the second embodiment.

In this way, in the second and third embodiments, the programmable $Si_3N_4$ insulating films 16, 46 are provided at least on the side walls $E_2$, $E_3$ of the gate electrodes and on the bottom face $E_5$ of the gate electrode, so that the resultant non-volatile cells can be reduced in size, and the non-volatile cells can be adjustable for providing mass storage.

As has been described, according to the present invention, since a programmable insulating film provided in contact with a side wall at least on one side of a gate electrode and with one of impurity diffusion layers on the same side, writing can be executed by breaking down the insulating film by a voltage applied to the gate electrode. As a result, the resultant cell can be reduced in size, while being adjustable for mass storage.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A non-volatile memory cell of which includes a single MOS transistor, comprising:
   a semiconductor substrate;
   source and drain diffusion layers and a channel region between said source and diffusion layers formed on a surface of said semiconductor substrate;
   a gate electrode disposed over said semiconductor substrate with a gate insulating film interposed between said gate electrode and said channel region; and
   a programmable insulating film provided in self-alignment between said gate electrode and either one of said source and drain diffusion layers so that said programmable insulating film is selectively broken down by a predetermined voltage applied to said gate electrode to execute programming and electrically conduct between said gate electrode and either one of said source and drain diffusion layers, and a breakdown voltage of said gate insulating film is higher than that of said programmable insulating film and said predetermined voltage;
   said gate insulating film and said programmable insulating film disposed adjacent to each other under said gate electrode.

2. A non-volatile memory cell according to claim 1, wherein said gate insulating film comprises an $SiO_2$ film and said programmable insulating film comprising an $Si_xN_{1-x}$ film ($0<X<1$) which requires a smaller charge for being broken down than said $SiO_2$ film.

3. A non-volatile memory according to claim 1, wherein said programmable insulating film is provided on an upper surface of said gate electrode and on side walls of said gate electrode including either one of said source and drain diffusion layer regions.

4. A non-volatile memory according to claim 1, wherein said programmable insulating film is provided in self-alignment between said gate electrode and said diffusion layer.

5. A non-volatile memory cell according to claim 1, wherein either said source or drain diffusion layer is grounded at a side free from the formation of said programmable insulating film at the time of programming.

6. A non-volatile memory cell of which includes a single MOS transistor, comprising:
   a semiconductor substrate;
   source and drain diffusion layers and a channel region between said source and drain diffusion layers formed on a surface of said semiconductor substrate;
   a gate electrode disposed over said semiconductor substrate with a gate insulating film interposed between said gate electrode and said channel region; and
   a programmable insulating film provided in self-alignment between said gate electrode and either one of said source and drain diffusion layers and between said gate electrode and a polysilicon spacer in ohmic contact with at least one of said source and drain diffusion layers and on a side wall of said gate electrode so that said programmable insulating film is selectively broken down by a voltage applied to said gate electrode to execute programming and electrically conduct between said gate electrode and either one of said source and drain diffusion layers, and a breakdown voltage of said programmable insulating film is smaller than that of said gate insulating film.

7. A non-volatile memory cell according to claim 6, wherein said gate insulating film comprises an $SiO_2$ film and said programmable insulating film comprising an $Si_xN_{1-x}$ film ($0<X<1$) which requires a smaller charge for being broken down than said $SiO_2$ film.

8. A non-volatile memory cell according to claim 6, wherein either said source or drain diffusion layer is grounded at a side free from the formation of said programmable insulating film at the time of programming.

* * * * *